Figure 1:
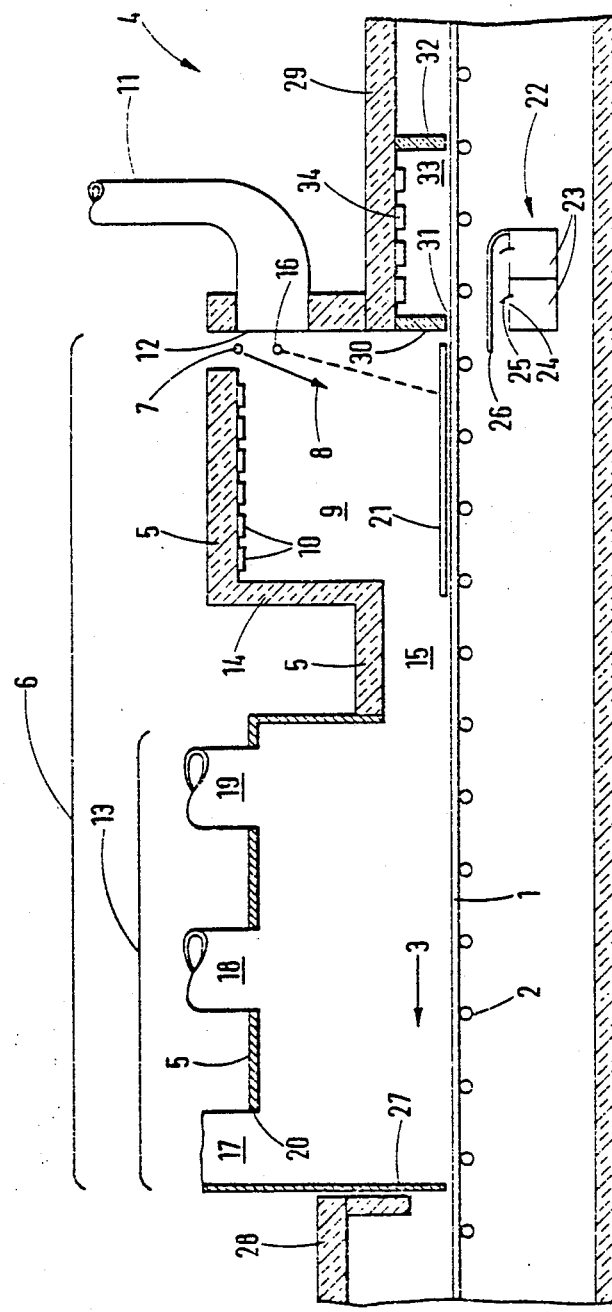

United States Patent [19]

Thomas et al.

[11] Patent Number: 4,917,717
[45] Date of Patent: * Apr. 17, 1990

[54] APPARATUS FOR AND PROCESS OF COATING GLASS

[75] Inventors: Jean-Francois Thomas, Ottignies; Robert Terneu, Thiméon; Albert Van Cauter, Charleroi; Robert Van Laethem, Loverval-Gerpinnes, all of Belgium

[73] Assignee: Glaverbel, Brussels, Belgium

[ * ] Notice: The portion of the term of this patent subsequent to Nov. 7, 2006 has been disclaimed.

[21] Appl. No.: 930,757

[22] Filed: Nov. 14, 1986

[30] Foreign Application Priority Data

Dec. 20, 1985 [GB] United Kingdom ................. 8531423

[51] Int. Cl.⁴ ............................................ C03C 17/00
[52] U.S. Cl. ....................................... 65/60.1; 65/60.3; 65/60.52; 65/90; 65/181; 65/193; 118/50.1; 118/326; 118/718; 427/109; 427/166; 427/226
[58] Field of Search ..................... 65/60.1, 60.3, 60.52, 65/90, 181, 193; 427/109, 166, 226; 118/50.1, 326, 718

[56] References Cited

U.S. PATENT DOCUMENTS

| | | | |
|---|---|---|---|
| 4,123,244 | 10/1978 | Leclercq et al. | 65/60.3 X |
| 4,329,379 | 5/1982 | Terneu et al. | 427/166 |
| 4,349,369 | 9/1982 | Laethem et al. | 65/60.52 |
| 4,349,371 | 9/1982 | Laethem et al. | 65/60.4 |
| 4,536,204 | 8/1985 | Laethem et al. | 65/60.3 X |

FOREIGN PATENT DOCUMENTS 2131792 6/1984 United Kingdom ............... 65/60.52

*Primary Examiner*—Arthur Kellogg
*Attorney, Agent, or Firm*—Spencer & Frank

[57] ABSTRACT

Apparatus for pyrolytically forming a metal compound coating on an upper face of a hot glass substrate 1 comprises conveyor means 2 for conveying the substrate 1 in a downstream direction 3. A coating chamber 6 opening downwardly onto the path 1 and means 7 for spraying coating precursor downwardly towards the substrate.

The spraying means 7 is located to spray the coating precursor solution from a height above the substrate path 1 of at least 75 cm. Heating means are provided for supplying heat to the spraying zone 9. Means such as aspirator boxes 39 is provided for generating aspirating forces on atmospheric material within the passageway 13 to encourage such material to flow along the substrate path to the downstream end (27) of the passageway and to enter exhaust ducting leading such material away from the substrate path.

In operation, the spraying zone 9 of the coating chamber 6 is heated to cause evaporation of part of the coating precursor material before it reaches the substrate 1 to charge the atmosphere in that zone with vaporized coating precursor material. The solution is sprayed with sufficient energy to ensure positive impact of residual sprayed coating precursor material against the substrate to initiate coating of the substrate face, and atmosphere laden with coating precursor material in the vapor phase is caused to flow in the downstream direction from the spraying zone 9 along and in contact with the coated substrate face for a contact time of at least 10 seconds, whereafter residual material of the precursor laden current is directed away from the substrate.

58 Claims, 5 Drawing Sheets

APPARATUS FOR AND PROCESS OF COATING GLASS

This invention relates to apparatus for pyrolytically forming a metal compound coating on an upper face of a hot glass substrate in sheet or ribbon form comprising conveyor means for conveying a said substrate in a downstream direction along a path, a coating station comprising a roof structure defining a coating chamber opening downwardly onto said path and means for spraying coating precursor solution into said chamber, downwardly towards the substrate. The invention also relates to a process of pyrolytically forming a metal compound coating on an upper face of a hot glass substrate in sheet or ribbon form during its conveyance in a downstream direction along a path through a coating chamber in which at least one stream of coating precursor solution is sprayed downwardly towards the substrate.

Such apparatus and processes are useful in the manufacture of coated glass for various purposes, the coating being selected to confer some particular desired property on the glass. Especially important examples of coatings which may be applied to glass are those designed to reduce the emissivity of the coated face in respect of infra-red radiation, especially infra-red radiation having wavelengths in excess of $3\mu m$, and those designed to reduce the total energy transmissivity of the coated glass in respect of solar radiation. It is known, for example, to provide glass with a low infra-red emissivity coating of tin dioxide for heat conservation purposes, and it is also known to provide glass with a solar energy transmissivity reducing coating of a metal oxide such as titanium dioxide or of a mixture of metal oxides such as $Fe_2O_3 + CoO + Cr_2O_3$ with the principal object of reducing solar heat gain or glare.

It will be apparent that coatings which are applied to glass to be used for glazing purposes should have a high and uniform optical quality. Because the coatings are usually applied to a thickness of between about 30 nm and 1200 nm, depending on the nature of the coating material and the properties required, variations in the thickness of a coating can give rise to objectionable interference effects, so a uniform thickness is important for good optical quality. But it is also particularly important that the coatings should be free from stains and other localised defects and that they should have a fine and uniform crystal structure.

It is by no means easy to form pyrolytic coatings which are consistently of good optical quality, particularly at rather high deposition rates as are required for forming thick coatings on rapidly moving glass substrates, for example a 750 nm thick coating of tin oxide on a freshly formed ribbon of float glass travelling at over 8 meters per minute. Faults in uniformity of thickness, composition and/or structure are very liable to occur in industrial scale coating plant and much research has been devoted to finding a solution to this problem.

Such research has explored the possibilities of using apparatus for performing two techniques of coating deposition, namely deposition from coating precursor material in the vapour phase, and deposition from coating precursor material in the liquid phase.

In vapour phase deposition, research has led to a technique in which coating precursor material in the vapour phase is caused to enter a coating chamber and flow as a smooth, well controlled, non-turbulent and uniform current in contact with the substrate being coated. However, while we have found that such a technique can result in the formation of a coating of a fine and uniform structure, we have not been able to achieve a satisfactory regularity of thickness to satisfy current commercial requirements especially for glazings of large sizes as are increasingly required by modern architectural practice. It has simply not been possible to construct apparatus which allows the required degree of control to be exercised over the introduction of the coating precursor material into the coating chamber so that it will flow uniformly and smoothly in contact with the glass when operating on a commercial scale, with the result that unpredictable thickness variations are present in the coatings formed and a proportion of the coated glass produced is not of an acceptable quality. Furthermore, it is necessary to use a rather volatile coating precursor material and this represents an undesirable limitation on the choice of available materials. Also, known vapour phase coating processes do not readily lend themselves to the formation of coatings having a thickness of more than about 400 nm, especially when the glass is moving rather rapidly as may be dictated by other plant used in the industrial production programme.

In order to form thicker coatings, it is conventional to use a liquid phase or spray coating apparatus for spraying a stream of droplets of coating precursor solution onto the substrate. Such apparatus simplifies handling of the large quantities of precursor material required, but it does suffer from a number of disadvantages. Firstly, there is a serious risk that the contact between the usually rather large quantities of coating solution sprayed and the hot glass substrate will give rise to steep thermal gradients within the glass with the result that on cooling subsequent to the coating operation the glass is highly stressed. This can make it very difficult to cut the glass into sheets or smaller sheets if this should be required, and it renders the glass easily frangible. Secondly, it is very difficult to achieve a coating of high and uniform quality.

In the search for improvements in quality, attention has so far been primarily concentrated on the conditions at, and in the immediate vicinity of, the zone where the droplets of sprayed material impinge on the glass. Coating defects are very liable to occur in this region either because of the entrainment of reaction products from the gaseous environment by the sprayed droplet stream or because of splashing of the droplets on impact with the glass. In order to avoid such faults various proposals have been made involving the generation of scavenging gas streams for sweeping potentially harmful material from the environment in the immediate vicinity of the impingement zone. In one known procedure a continuous ribbon of glass is conveyed through a coating chamber where it is sprayed with a coating precursor solution from a transversely reciprocating spray head. The spray head is controlled so as to achieve a steady droplet deposition at the impingement zone and a scavenging gas stream is blown along the glass, through that chamber, so as to clean the environment in that transverse path, ahead of the droplet stream. The scavenging gas stream can be continuous in which case it inevitably impinges against the sprayed droplet stream. But in that case care is taken to restrict the scavenging gas stream velocity so that it does not disturb the steady and stable conditions at the impingement zone.

The steady and gentle droplet deposition required is conditional upon a sufficiently low kinetic energy of the sprayed solution droplets. Therefore the use of that apparatus is limited in regard to the coating rates which can be achieved.

With a view to forming good quality coatings more rapidly, it has been proposed to use a spray of very much higher energy and simultaneously to blow strong gas currents against and around the sprayed droplet stream in the vicinity of the impingement zone so that the droplets which will inevitably splash or bounce from the glass are immediately entrained away. Although faster coating formation rates are possible by this procedure the avoidance of spurious deposits in consequence of the droplet splashing requires the scavenging gas blower(s) to be very carefully directed and controlled. The scavenging gas has to be delivered from nozzles which are closely associated with the spray head and move as a unit therewith along its transverse path. When using the said high energy spraying procedure the glass is particularly liable to become highly stressed, and furthermore defects within the coating have been found to occur with unacceptable frequency even after the most careful adjustments of the spray head and the associated scavenging gas jet blowers.

We have found, when operating the known spraying apparatus, despite careful control of the spraying environment, that the coatings often do not have the structural characteristics necessary for a high optical quality and that it is difficult to obtain those characteristics in a reliable and reproducible way, the difficulty being greater the higher is the attempted coating deposition rate. In particular, we have found that the resulting coatings have high haze factors, but what is even more objectionable is that the haze factor is irregular over the area of the coating.

It is an object of the present invention to provide apparatus which can be used to form coatings of high optical quality and uniform structure reliably and reproducibly, even at high coating deposition rates, and without inducing such high thermal stresses in the glass substrate.

According to the present invention, there is provided apparatus for pyrolytically forming a metal compound coating on an upper face of a hot glass substrate in sheet or ribbon form comprising conveyor means for conveying a said substrate in a downstream direction along a path, a coating station comprising a roof structure defining a coating chamber opening downwardly onto said path and means for spraying coating precursor solution into said chamber, downwardly towards the substrate, characterised in that: the spraying means is located to spray said coating precursor solution into a spraying zone of said coating chamber from a height above the substrate path of at least 75 cm; heating means is provided for supplying heat to said spraying zone; said roof structure defines a passageway portion of said coating chamber leading downstream from said spraying zone and imparting to the coating chamber a total length of at least 2 meters; and means is provided for generating aspirating forces on atmospheric material within such passageway to encourage such material to flow along the substrate path to the downstream end of said passageway and to enter exhaust ducting for leading such material away from the substrate path.

Apparatus according to the invention is more economical to run than conventional vapour coating apparatus in which all coating precursor material must be vaporised before contact with the glass, and it is simpler to construct than known spraying apparatus in particular because the problems associated with splashing and entraining large quantities of sprayed coating precursor solution away from the zone where the coating is formed are avoided.

When using an apparatus according to the invention as above defined, we have found it very much easier to form coatings of high optical quality and uniform structure reliably and reproducibly, even at high coating deposition rates, and without inducing high thermal stresses in the glass. In particular, we have found it very much easier to form coatings which have a low, and uniformly low, haze factor.

Of course in order to achieve such reproducible high coating quality, the apparatus should be used in a suitable way, but the combination of features of the apparatus as defined above is particularly beneficial for facilitating control of conditions within the coating chamber. In order to achieve these good results, we have found when using the apparatus that it is best to control conditions so that a substantial proportion of the coating precursor solution is evaporated before it contacts the substrate so that the atmosphere within the spraying zone becomes charged with coating precursor vapour which is then drawn along the passageway where it covers and remains in contact with the substrate.

In fact this represents a radical departure from the teaching of the prior art in this field. It has hitherto been thought necessary to control conditions so that as little precursor material as possible becomes vaporised in order to prevent it from reacting with the atmosphere within the spraying zone and form reaction products which could deposit on the substrate and form defects on the coating. It has also been thought necessary to aspirate excess coating precursor material and reaction products away from the substrate as soon as possible, again to prevent spurious deposition on the substrate, and coating zone lengths of 60 cm to 100 cm are typical of those found in the prior art.

The reasons why the use of such apparatus should favour better coating quality standards are not wholly clear, but the fact remains that with the aid of such apparatus we are able to form coatings with a more uniform and lower haze factor than has been possible before. The coatings formed can have a high optical quality, and a regular and predictable thickness. Furthermore, by using such apparatus, we are able to form these coatings on glass substrates more rapidly, and therefore to greater thicknesses or onto more rapidly moving substrates, than we have hitherto been able.

A particularly important use for apparatus according to the invention is in the formation of tin oxide coatings using stannous chloride as the coating precursor material. Tin oxide coatings, which reduce the emissivity in respect of long wavelength infra-red radiation of the surfaces of glass sheets to which they are applied, are widely used for reducing heat transfer from glazed structures. This of course is only an example of the purpose for which the apparatus can be used. As another example, the apparatus can be used for forming a coating of titanium dioxide or of a mixture of oxides such as a mixture of cobalt, iron and chromium oxides.

The apparatus is particularly beneficial for rapid coating formation such for example as is required for forming relatively thick coatings, for example a coating of 500 nm to 1000 nm in thickness, on a freshly formed ribbon of glass travelling at several meters per minute from a float tank or other flat glass forming plant.

Preferably, said coating chamber has a length of at least 5 meters. It has been found that this is particularly beneficial for the formation of relatively thick coatings, for example those of 500 nm or more in thickness, because for a given speed of substrate advance, it allows a longer contact time between coating precursor vapour and the substrate for deposition of additional coating material and/or for conditioning material already deposited.

In especially preferred embodiments of the invention, said spraying means is located to spray said coating precursor material from a source which is at least 1 meter, and preferably at least 1.2 meters, above said substrate path. This allows a long trajectory for the sprayed material so giving more time for that material to become evaporated before contact with the glass, and it entails a tall spraying zone which can then serve as a reservoir for the evaporated material from which that material can be drawn downstream into the passageway. Apparatus incorporating this preferred feature may be contrasted with previously known spraying apparatus in which a spray discharge height of 30 cm or less is usual.

In particularly advantageous embodiments of the invention, at the downstream end of the spraying zone, said roof structure descends substantially vertically to define an exit slot leading into said passageway. This gives very important benefits. The reservoir effect in the spraying zone is enhanced so that it is easier to draw atmospheric material which is uniformly laden with coating precursor vapour into the passageway, and furthermore, that vapour laden atmosphere is thereby constrained to flow down towards the substrate.

Preferably, the height of said exit slot is at most half of the height between the spray source and said substrate path. This is found to allow room for good mixing of atmospheric material in the upper half of the spraying zone out of line with the exit slot, and it further promotes the uniformity with which the atmosphere therein can be laden with coating precursor vapours.

Advantageously, at least a part of the length of said passageway has less height than the spraying zone. Atmospheric material flowing along such less tall passageway length is thereby physically constrained to flow relatively close to the substrate so that coating precursor vapour entrained therein can act on the coating.

In some preferred embodiments of the invention, said roof structure converges towards the substrate path in the downstream direction over the length of said passageway. This enhances the downward constraint of atmospheric material within the passageway, notwithstanding any depletion in the volume of that material as it travels in the downstream direction.

In other preferred embodiments of the invention, said roof structure includes a bridge wall over the substrate path defining an exit slot from the spraying zone and separating that zone and a said passageway, such passageway having a height greater than that of the exit slot. In such constructions, atmospheric currents entering the passageway from the exit slot will naturally slow down, and it is possible to rely at least in part on the high density of the coating precursor vapours to keep them in contact with a substrate travelling through the apparatus.

In particularly advantageous embodiments of the invention, the spraying means is arranged to spray the coating precursor material downwardly and in the downstream direction. This facilitates the discharge of the coating precursor material while maintaining a general downstream flow in the coating chamber, it lengthens the trajectory of the sprayed material as compared with vertical spraying from the same height so giving more time for evaporation from the solution, and it facilitates the disposition of heating means in the spraying zone so that such means may have a direct effect on the sprayed material.

Preferably, means is provided for discharging coating precursor material and at least one stream of gas into said spraying zone in intersecting directions. This is a very simple means of ensuring mixing of the materials which will be introduced into the spraying zone during use of the apparatus, without requiring any special mixing apparatus which would have to be able to withstand the hot and corrosive atmosphere which would be generated in that zone.

Advantageously, there is at least one such gas discharge means having a discharge orifice located in the upper half of the height between the spray source and said substrate face. The use of such apparatus is most effective for promoting mixing without too much disturbance to the atmosphere immediately above the substrate track.

In especially preferred embodiments of the invention, means is provided for preheating at least one said stream of gas. This inhibits the condensation of the sprayed material. It is desirable to avoid condensation of coating precursor vapours on the walls or roof of the chamber since this would often lead to corrosion, and there is a risk that any such condensed material could then drip down onto a substrate and stain a coating being formed.

In some preferred embodiments of the invention, there is at least one such gas discharge means arranged to discharge a said gas stream from upstream of the coating precursor spray discharge axis. The discharge of gas from such means promotes a favourable circulation of gas currents within the coating chamber.

Preferably, downwardly directed radiant heating means is provided above the spraying zone. This is a very simple way of providing heat for the evaporation of the sprayed coating solution. Such heating means is also useful for increasing the temperature within the spraying zone so that coating formation can be at least initiated at a higher temperature, giving benefits in the yield and durability of the coating formed, and for inhibiting condensation on the roof of the spraying zone.

Preferably, means is provided for heating said passageway from above. Such heating means is useful for increasing the temperature within the passageway so that the coating can be finished or conditioned at a higher temperature, giving benefits in the hardness and durability of the coating formed, and for inhibiting condensation on the roof of the passageway.

In some preferred embodiments of the invention, upstream of the discharge axis of the precursor spraying means, means is provided for discharging a jet of gas downwardly in the vicinity of said discharge axis, thereby to shield the sprayed coating precursor material. This helps to prevent the entrainment of any undesired material, for example coating reaction products, in the rear part of the stream.

Preferably, the coating precursor spraying means comprises a spray nozzle and means for repeatedly displacing such nozzle along a path transverse to the path of the substrate. This promotes mixing of evaporated coating precursor material in the atmosphere contained within the spraying zone of the coating chamber.

Advantageously, means is provided for repeatedly displacing such shielding gas jet discharge means along a path transverse to said path in tandem with the coating precursor spray nozzle. This allows an efficient shielding while introducing relatively small quantities of shielding gas.

In some preferred embodiments of the invention, means is provided for blowing gas upwardly past each side of the substrate path in the spraying zone. Such blowing means can be used to form gas shields against the side walls of the spraying zone of the coating chamber which serve to protect those walls against the corrosive effects of the sprayed material and its reaction products. Such gas shields can also inhibit the sprayed material, particularly when relatively small quantities are sprayed, from passing beneath the substrate path where it would be available to form an undesired coating on the under surface of a substrate.

Preferably, exhaust ducting is located at the downstream end of said coating chamber, and has one or more inlets located over the substrate path and extending across at least the major part of its width. Such exhaust ducting is of simple construction and is very easy to locate and allows an efficient aspiration of material away from the path of the substrate. The use of such ducting is particularly suitable for causing the aspirated material to travel substantially in the downstream direction until it enters the ducting, and this gives least disturbance to the flow pattern within the passageway. The adoption of this feature is most desirable when very large quantities of coating precursor solution are sprayed into the chamber.

Advantageously, a curved exhaust scoop is provided at such an over-path exhaust inlet. It has been found that this arrangement allows a highly efficient aspiration of coating reaction products and unused coating precursor material, since such atmospheric material can thereby be caused to flow more smoothly into the exhaust ducting. This gives very important practical benefits, especially when forming relatively thick coatings, and can for example result in the formation of a tin oxide coating of reduced emissivity. It is preferred that said exhaust scoop is movable for adjusting the clearance between its base and the path along which the glass is displaced, for example by means of a pivotal mounting, so as to achieve the maximum closure of the downstream end of the coating station.

Depending on pressure conditions above and below the substrate at the coating chamber there may be a tendency for the precursor laden atmosphere to flow beneath the substrate where it will deposit an undesired coating on its under surface. Depending on the flow pattern of atmospheric currents in and below the coating chamber, this undesired coating may be more or less regular, but so thin as to give rise to highly objectionable interference effects, for example it may be a more or less regular coating whose thickness decreases towards the centre of the substrate, or it may be a rather irregular coating of a pattern thought by some to be reminiscent of the markings on a backgammon board. This tendency is to some extent inhibited by the provision of upwardly directed blowing means at the sides of the spraying zone as aforesaid. But there may alternatively be a tendency for atmospheric material from beneath the substrate path to flow upwardly and dilute the concentration of precursor vapour especially at the sides of the coating chamber. This is undesirable since it may lead to insufficient vapour phase deposition on the margins of a substrate or to insufficient conditioning of the coated margins of such a substrate, and accordingly, in particularly advantageous embodiments of the invention, means is provided for inhibiting flow of atmospheric material past the sides of the substrate path and between zones vertically above and vertically below that path over at least part of the length of the coating chamber.

Preferably, such flow inhibiting means comprises baffles, since they are a very simple way of achieving the desired result. Such baffles may be located to create a substantially closed coating chamber, so that the atmosphere therein is not affected by external gas currents. A very simple and preferred way of achieving such substantial closure is to provide conveyor means comprising rollers which are rebated over each margin of the substrate path to define a space for accommodating said baffles between the rollers and the margins of the substrate path. This allows the whole upper face of the substrate to be coated.

We have referred to the provision of exhaust ducting located across the substrate path at the downstream end of the coating chamber passageway. However, providing means for exerting aspirating forces at that location alone can give rise to a higher concentration of coating precursor vapour along the centre of the passageway than over the margins of the substrate path. This is another possible cause of unsatisfactory coatings on the substrate margins. In order to reduce this tendency, and to increase the usefully coated width of the substrate, it is especially preferred that means be provided for generating aspirating forces in side exhaust ducting located to cause atmospheric material above the substrate path to flow outwardly away from the centre of that path over at least a portion of said passageway. The adoption of this preferred feature gives advantages which are considered to be of particular importance. It promotes a good spread of the precursor laden atmosphere over the full width of the substrate, thus increasing the well-finished coated width of the substrate. It is also helpful in removing excess coating precursor material and coating reaction products at a stage before they reach the end of that passageway, so reducing risk of corrosion of the walls of that passageway. In addition, it enables removal of coating reaction products and excess coating precursor material which could settle on the coating to stain it. Also, if there is any tendency for the atmosphere from beneath the substrate path to flow upwards past its sides, this tendency is inhibited over the zone of outward aspiration. These advantages are promoted if, as is preferred, such side exhaust ducting is located to aspirate said atmospheric material outwardly over a zone extending along substantially the whole of said passageway.

In some preferred embodiments of the invention, said side exhaust ducting has entrances which are located beneath the level of said path. This is beneficial because it facilitates visual inspection of conditions within the passageway through ports which may be provided in its side walls, and in use, it facilitates finishing of the coating by holding down a layer of dense coating precursor vapours against the substrate face being coated.

One cause of defects in a pyrolytically formed coating is particles of extraneous material which become incorporated in the coating during its formation. It is apparent that in the course of the coating operation, the coating chamber becomes charged with unused coating precursor material and coating reaction products, including intermediate reaction products. It has been noted that these and other pollutants such as dust (the coating precursor material is itself considered a pollutant everywhere it can contact the hot glass outside the coating chamber) tend to spread upstream from the chamber into which the coating precursor material is discharged, no matter how small is made the entrance through which the glass enters that chamber, and in fact those pollutants are apt to contact the glass before it reaches the coating region and to leave spurious deposits on the substrate which remain there to be incorporated in the coating as defects, for example at the coating/glass interface or within the thickness of the coating.

Advantageously, means is provided for discharging gas into the environment of the substrate so as to form a continuous current flowing in the downstream direction beneath each margin of the substrate path and along at least part of the path length occupied by said coating chamber.

Surprisingly, it has been found that the use of apparatus incorporating this preferred feature results in a significant clearance of the atmosphere which would be in contact with the glass prior to its entry into the coating chamber, so that there is a considerable reduction in the amount of pollutants there available to form spurious deposits on the glass before coating.

A possible explanation for this phenomenon is as follows.

Upstream of the coating chamber there will be plant for heating the glass substrate, or for actually forming a hot glass substrate, and downstream of the coating chamber there will usually be means, for example an annealing lehr, allowing controlled cooling of the coated substrate. In such constructions there may be a return current of atmospheric material which flows in the upstream direction beneath the substrate path. As this return current flows upstream it may tend to rise above the substrate path, so that any entrained pollutants are liable to deposit on the substrate so forming defects embedded in the coating.

The use of apparatus having this preferred feature of the invention also affords certain very important advantages in reducing undesired under surface coating, and insofar as the quality of the coating formed is concerned.

These advantages are enhanced when, as is preferred, means for discharging gas to form such a below path level current is located to discharge gas to form such a current over the full width of the substrate path.

Preferably, means is provided for preheating the gas to be discharged to form such below substrate current(s) for example to within 50° C. of the mean temperature of the substrate immediately prior to coating, so as to reduce any effect the injection of that gas may have on the temperature of the substrate and/or of the atmosphere in the coating region.

In especially preferred embodiments of the invention, a barrier wall is provided above the substrate path extending across the full width of and substantially closing the downstream end of said coating chamber. Such a barrier wall may for example be constituted at least in part by a said exhaust scoop if such be provided. This is a very simple way of ensuring that changes in conditions immediately downstream of the end of the coating chamber will have no direct effect on conditions within the coating chamber, and vice versa.

In particularly preferred embodiments of the invention, said coating station is located between the exit from a ribbon forming plant and the entrance to an annealing lehr. When this is done, it will be found that the glass can reach the coating station at a temperature which is, or is close to, that required for the pyrolytic coating reactions to take place. Accordingly, the adoption of this feature dispenses with the need for further heating apparatus such as would be required to raise the temperature of the glass to be coated from room temperature. It is also important that the coating should take place within a chamber which is physically distinct from the ribbon forming plant on the one hand and the annealing lehr on the other hand. If there is no such distinction, and it is common in previously known proposals in this field for the coating to take place within the length of the annealing lehr, then atmospheric conditions within the coating chamber would be apt to be disturbed by currents of gas flowing from the annealing lehr and from the ribbon forming plant —such currents often entrain dust and other pollutants which might become incorporated in the coating as defects —and also, there would be a risk that the pattern of atmospheric currents in the lehr would be disturbed so leading to less favourable annealing conditions.

In some preferred embodiments of the invention, means is provided for causing gas to flow through a substrate entry slot of said chamber from upstream thereof and for preheating that gas, and advantageously, the means causing such gas entry, and/or the shape of the entry slot, is such as to cause a greater volume flow rate of such gas over margins of the substrate path than over its centre. The use of apparatus incorporating one or both of these features is of value in promoting a general downstream flow of the atmospheric material within the coating chamber and has value in conditioning the atmosphere in the zone where coating material is first deposited on the substrate. For example, it may allow at least partial compensation for cooling of the atmosphere within the coating chamber by contact with its side walls.

Apparatus according to the present invention may with advantage also incorporate one or more features of apparatus disclosed in in our copending British Patent Application filed on this date (Dec. 20, 1985, application Ser. No. 85 31 425), which application describes and claims apparatus for pyrolytically forming a metal compound coating on an upper face of a hot glass substrate in sheet or ribbon form comprising conveyor means for conveying a said substrate along a path in a downstream direction, a roof structure defining a coating chamber opening downwardly onto said path and means for discharging coating precursor material into said chamber, characterised in that upstream of said coating chamber there is an antechamber which communicates with the coating chamber via an entry slot which is defined in part by the path of the substrate, and via which gas can be caused to flow into the coating chamber so as to form (when the apparatus is in use) a blanket layer which covers the upper face of the substrate along a first part of the length of said chamber, and in that means is provided for controllably preheating the gas forming said blanket layer.

The present invention extends to a process of pyrolytically forming a metal compound coating on an upper face of a heated glass substrate in which process use is optionally, but preferably, made of apparatus as herein defined.

Accordingly, the present invention also provides a process of pyrolytically forming a metal compound coating on an upper face of a hot glass substrate in sheet or ribbon form during its conveyance in a downstream direction along a path through a coating chamber in which at least one stream of coating precursor solution is sprayed downwardly towards the substrate, characterised in that: a spraying zone of said coating chamber is heated to cause evaporation of part of the coating precursor material before it reaches the substrate to charge the atmosphere in such zone with vaporised coating precursor material; the solution is sprayed with sufficient energy to ensure positive impact of residual coating precursor material against the substrate to initiate coating of said substrate face; and atmosphere laden with coating precursor material in the vapour phase is caused to flow in the downstream direction from said spraying zone along and in contact with the coated substrate face for a contact time of at least 10 seconds, whereafter residual material of said precursor laden current is directed away from the substrate.

Such a process is useful for the formation of coatings exhibiting low and uniformly low haze. This is particularly surprising since it has hitherto been thought necessary to remove coating precursor and reaction product vapours from the substrate as rapidly as possible —contact times of between 2 and 5 seconds are used in previously known processes —precisely in order to reduce the risk of spurious depositions from those vapours which would lead to an increase in haze.

The reasons why the use of such a process should favour better coating quality standards are not wholly clear. One possible explanation is that a substantial proportion of the thickness of the coating is built up from precursor material in the vapour phase as the substrate travels through the passageway portion of the coating chamber. Vapour phase deposition techniques are known to favour a fine and uniform crystal structure in the coating. But this does not explain why the use of a process according to this invention should result in the formation of a coating which has a far more regular thickness than can be obtained by the use of conventional vapour phase deposition processes. Another possible explanation is that although only a small proportion of the coating thickness is attributable to vapour phase deposition, there is a conditioning of the newly formed main body of the coating during the said contact time of at least 10 seconds in which the substrate is exposed to coating precursor vapour so that the crystal structure of the coating can be modified in a way that is favourable for coating quality, and in particular that exposure of the freshly formed coating to precursor vapour enables any small pores in the coating to be filled thus giving rise to a harder and more compact and weather-resistant coating.

It is possible that part of the explanation is that a favourable regular coating crystal structure at the coating/glass interface is promoted by the contact of coating precursor material with the glass if the precursor material is free from or is accompanied by only a small proportion of solvent. It is believed that the structure of the coating at that interface has a strong influence on the way in which the remainder of the coating thickness is built up.

It is also possible that the explanation lies partly in a reduced cooling effect on the glass at the zone where coating deposition takes place, so that the reactions which take place while the full thickness of the coating is being built up can take place at a higher and more nearly uniform temperature. This is thought to be favourable for the deposition of a coating of uniform structure, and it also tends to increase the yield of coating formed from a given quantity of coating precursor material. It is to be noted here that the rate at which the coating reactions take place increases with temperature, and also that a coating formed at a higher temperature is in general more strongly adherent to the glass than one of the same composition but formed at a lower temperature, so that it is more durable. Furthermore, such a reduced cooling effect would entail that there is a reduced risk of undesirable thermal stresses in the glass. Such a risk can be very real when large quantities of liquid coating precursor solution impinge against the glass as may be required in certain prior art spray coating techniques, especially when it is desired to form thick coatings on a rapidly moving substrate.

Another theory which may be valid and partly explain the results is that spraying the precursor material through the evaporation promoting environment within the downwardly opening chamber has the consequential effect that the zone at which the sprayed precursor material first contacts the glass is dominated by the continuous supply of fresh reactant and is kept free or relatively free of other materials.

Preferably, said coating chamber has a length which is so related to the speed of conveyance of the substrate that any increment of the length of the substrate remains exposed to coating precursor vapour for at least twenty seconds. This facilitates the formation of thick coatings, for example those above 500 nm in thickness as may be required for infra-red radiation screening purposes, and we have rather surprisingly found that there is still no adverse effect on the quality of the coating formed. It will be appreciated that where the coating is deposited between the exit from a glass ribbon forming plant and an annealing lehr, the speed of advance of the ribbon will be governed by the rate at which the ribbon is formed, and that this will vary according to the capacity and the type of ribbon forming plant, for example whether it is a glass drawing machine or a float glass producing plant, and also according to the thickness of the glass being produced. However even the highest glass ribbon speeds are usually less than 12 meters per minute, and accordingly a twenty second exposure time can usually be assured if said coating station has a length of at least 5 meters.

In especially preferred embodiments of the invention, said coating precursor solution is sprayed from a source which is at least 75 cm, and preferably at least 1.2 meter, above said substrate face. This will allow ample time for evaporation of those droplets before they impinge on the substrate, and it also allows the intensity with which the droplet residue stream contacts the surface of the substrate to be reduced. In fact this feature itself represents quite a radical departure from previously known proposals. In previously known spray coating techniques, coating precursor material is sprayed from much closer to the substrate, and a spray nozzle height of 30 cm or less is common.

In particularly advantageous embodiments of the invention, the vapour laden atmosphere is withdrawn from the spraying zone into a downstream passageway portion of the coating chamber via an exit slot of lesser height than the spraying zone. This helps to ensure that the precursor laden atmosphere is brought down against the substrate in concentrated manner so promoting the coating yield.

Preferably, the height of said exit slot is at most half of the height between the spray source and said substrate face. The adoption of this feature leaves at least the upper half of the spraying zone for the circulation of gas currents, and that upper part of the chamber can form a reservoir of high density vapour which feeds continuously into the slot.

Preferably, said downstream flow of precursor laden gas takes place within a passageway which is heated. This feature affords several important advantages. Condensation on the passageway roof of coating precursor material and/or reaction products which could then drip down to stain the substrate is inhibited, and the coating precursor material is maintained in the vapour phase. A high temperature can be maintained within the passageway by replacing at least some of the heat energy removed from the substrate by coating reactions, so that any further coating reactions and conditioning of the already formed coating can proceed at a higher temperature especially towards the downstream end of the passageway. This in turn promotes a more uniform crystal structure in the coating, and also tends to increase the durability and hardness of that coating.

In particularly advantageous embodiments of the invention, the coating precursor solution is sprayed downwardly and in the downstream direction. This promotes flow of the sprayed material towards the downstream end of the coating chamber into which it is sprayed, and at the same time, as compared with vertical spraying from the same height, lengthens the trajectory of that stream towards the substrate so allowing more time for evaporation of the sprayed solution.

Preferably, coating precursor material and at least one stream of gas are introduced into said spraying zone so that their trajectories intersect therein. This is found particularly beneficial for generating mixing forces within the spraying zone so assuring that coating precursor vapour is uniformly distributed in the atmosphere flowing downstream from that zone along and in contact with the upper face of the substrate.

Advantageously, at least one said stream of gas is discharged from an orifice located in the upper half of the height between the spray source and said substrate face. It has been found that this is most effective for promoting such mixing with the least disturbance to the trajectory of that material close to the substrate, so promoting the formation of a high quality coating.

It would be possible to supply heat to the gas discharged into the chamber after it had entered that chamber, but preferably, there is at least one said stream of gas which is preheated gas, since this reduces or eliminates any cooling effect due to that gas discharge.

In especially preferred embodiments of the invention, there is at least one said stream of gas which is discharged from the upstream side of the trajectory of the sprayed coating precursor solution. This promotes a favourable circulation of the atmosphere within the spraying zone and tends to reduce undesired turbulence.

Advantageously, heat is supplied to said spraying zone at least in part by directing radiant heat downwardly from above the path of the sprayed coating precursor solution. This assists in the evaporation of the sprayed coating precursor solution, especially in the upper regions of that path, and on its downstream side if the solution is sprayed in the downstream direction as aforesaid.

In some preferred embodiments of the invention, at the upstream side of the stream of coating precursor material, such stream is shielded by a jet of gas which is continuously discharged downwardly towards the substrate in the vicinity of said sprayed stream. This helps to prevent the entrainment of any undesired material, for example coating reaction products, in the rear part of the stream. The presence of such material is particularly disadvantageous there because it can lead to the formation of defects at the substrate/coating interface.

In especially preferred embodiments of the invention, said solution of coating precursor material is sprayed downwardly towards the substrate face as a droplet stream which is repeatedly displaced transversely of the substrate path. This promotes mixing of evaporated coating precursor material in the atmosphere contained within the spraying zone of the coating chamber.

Advantageously, such shielding gas jet is repeatedly displaced transversely of said path in tandem with the stream of coating precursor material. This affords a very efficient shielding for a given rate of gas introduction.

In some preferred embodiments of the invention, gas is blown upwardly past each side of the substrate path in the spraying zone. Such gas can form shields which serve to protect the side walls of the spraying zone of the coating chamber against the corrosive effects of the sprayed material and its reaction products. Such gas shields can also inhibit the sprayed material, particularly when relatively small quantities are sprayed, from passing beneath the substrate path where it would be available to form an undesired coating on the under surface of a substrate. This undesired coating may be more or less regular, but so thin as to give rise to highly objectionable interference effects, for example it may be a more or less regular coating whose thickness decreases towards the centre of the substrate, or it may be a rather irregular coating of a pattern thought by some to be reminiscent of the markings on a backgammon board.

There may alternatively be a tendency for atmospheric material from beneath the substrate path to flow upwardly and dilute the concentration of precursor vapour especially at the sides of the coating chamber. This is undesirable since it may lead to insufficient vapour phase deposition on the margins of a substrate or to insufficient conditioning of the coated margins of such a substrate, and accordingly, in particularly advantageous embodiments of the invention, over at least part of the length of the coating chamber, flow of atmospheric material past the side edges of the substrate and between zones vertically above and vertically below the substrate is inhibited.

In especially preferred embodiments of the invention, aspirating forces are generated in side exhaust ducting located to cause atmospheric material above the substrate to flow outwardly away from a central part of the substrate path over at least a portion of the length of said coating chamber. The adoption of this preferred feature gives advantages which are considered to be particular importance. It promotes a good spread of the precursor laden atmosphere over the full width of the substrate, thus increasing the well-finished coated width of the substrate. In addition, it enables earlier removal of coating reaction products and excess coating precursor material which could settle on the coating to stain it. It is also helpful in removing excess coating precursor material and coating reaction products at a stage before they reach the end of that passageway, so reducing risk of corrosion of the walls of that passageway. Also, if there is any tendency for the atmosphere from beneath the substrate path to flow upwards past its sides, this is inhibited over the zone of outward aspiration. These advantages are promoted if, as is preferred, said atmospheric material is caused to flow outwardly over a zone extending along at least the major part of, and preferably substantially the whole of, the length of said coating chamber downstream of the zone of first deposition of coating material on the substrate.

In some preferred embodiments of the invention, said atmospheric material is aspirated outwardly at a level beneath the substrate. This is beneficial because it facilitates finishing of the coating by holding a layer of dense coating precursor vapours down against the upper face of the substrate.

Advantageously, gas is discharged into the environment of the substrate so as to form a continuous current flowing in the downstream direction beneath each margin of the substrate and along at least part of the length of said coating chamber.

Surprisingly, it has been found that the adoption of this preferred feature results in a significant clearance of the atmosphere which would be in contact with the glass prior to its entry into the coating chamber, so that there is a considerable reduction in the amount of pollutants there available to form spurious deposits on the glass before coating. The adoption of this preferred feature of the invention also affords certain very important advantages in reducing undesired under surface coating, and insofar as the quality of the coating formed is concerned.

Advantageously, there is such a below substrate current of gas which flows under the full width of the substrate. The adoption of this feature promotes clearance of the atmosphere below the path of the substrate in a highly efficient manner, so avoiding spurious early deposits of material which has been entrained in return currents flowing beneath the substrate in the upstream direction.

Preferably, the gas discharged to form such below substrate current(s) is preheated to within 50° C. of the mean temperature of the substrate immediately prior to coating, so as to reduce any effect the injection of that gas may have on the temperature of the substrate and/or of the atmosphere in the coating region.

In especially preferred embodiments of the invention, the coating chamber is substantially closed at its downstream end to prevent interchange of atmospheric material between the downstream end of the coating chamber and a further downstream region of the substrate path. Such closure may for example be effected by exhaust ducting extended across the full width of the coating chamber at its downstream end. The adoption of this feature has the advantage of avoiding any dilution or pollution of the atmosphere in the downstream end of the coating chamber from the further downstream region, and it also prevents currents of the coating chamber atmosphere from interfering with any further processing of the substrate and from depositing any additional undesired material onto the coating.

In particularly advantageous embodiments of the invention, the glass substrate is a freshly formed ribbon of hot glass and the coating is formed after that ribbon leaves a ribbon forming plant, and before its entrance to an annealing lehr. The coating chamber may thus be located at a position where the glass is anyway at a temperature appropriate for the pyrolytic coating reactions to take place, so that costs involved in reheating the glass to such a temperature are avoided or substantially reduced. It is also important that the coating should take place within a chamber which is physically distinct from the ribbon forming plant on the one hand and the annealing lehr on the other hand. If there is no such distinction, and it is common in previously known proposals in this field for the coating to take place within the length of the annealing lehr, then atmospheric conditions within the coating chamber would be apt to be disturbed by currents of gas flowing from the annealing lehr and from the ribbon forming plant —such currents often entrain dust and other pollutants which might become incorporated in the coating as defects —and also, there would be a risk that the pattern of atmospheric currents in the lehr would be disturbed so leading to less favourable annealing conditions.

In some particularly preferred embodiments of the invention, preheated gas is caused to flow downstream into said coating chamber in contact with the substrate. The adoption of this feature is of value in promoting a general downstream flow of the atmospheric material within the coating chamber and has value in conditioning the atmosphere in the zone where coating material is first deposited on the substrate. For example, in some such preferred embodiments of the invention, such preheated gas is caused to enter said coating chamber at a higher volume rate over the margins of the substrate than over its centre. This allows at least partial compensation for cooling of the atmosphere within the coating chamber by contact with its side walls.

Indeed the present invention may with advantage be combined with the invention described in our said co-pending British Patent Application filed on this date (Dec. 20, 1985, application Ser. No. 85 31 425), which application describes and claims a pyrolytic coating process in which a hot glass substrate in sheet or ribbon form travels in a downstream direction beneath a coating chamber which opens downwardly towards the substrate and in which a coating is formed on the upper face of said substrate from coating precursor material, characterised in that the gaseous environment in the immediate vicinity of the upper face of the substrate at least in the zone at which such coating formation commences, is controlled by feeding preheated gas in a downstream direction into said chamber to enter the chamber in contact with the substrate and form a blanket layer which covers the substrate at least as far as that zone.

The present invention is particularly suitable for the formation of coatings at high build up rates, for example at rates in excess of 20 nm/second, as may, for example, be required for forming relatively thick coatings, such as a coating of 500 nm to 1000 nm in thickness, on a freshly formed ribbon of glass travelling at several meters per minute from a float tank or other flat glass forming plant.

A particularly important use for a process according to the invention is in the formation of tin oxide coatings using stannous chloride as the coating precursor material. Tin oxide coatings, which reduce the emissivity in respect of long wavelength infra-red radiation of the surfaces of glass sheets to which they are applied, are widely used for reducing heat transfer from glazed structures. This of course is only an example of the purpose for which the process can be used. As another example, the process can be used for forming a coating of titanium dioxide, or a coating of a mixture of oxides such as a mixture of cobalt, iron and chromium oxides.

This invention will now be described in greater detail with reference to the accompanying diagrammatic drawings of various preferred embodiments of apparatus according to the invention and by way of Examples of specific processes according to the invention performed using such apparatus.

Figure 2:
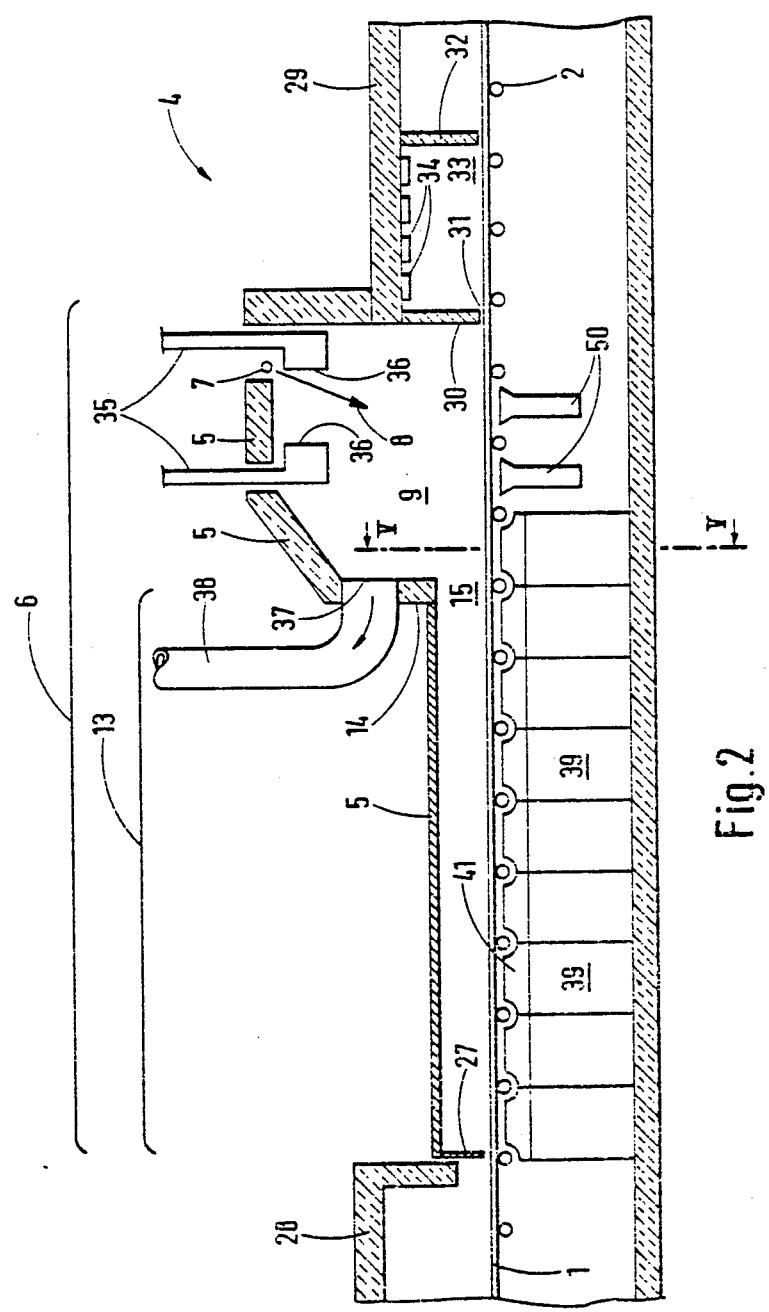
Figure 3:
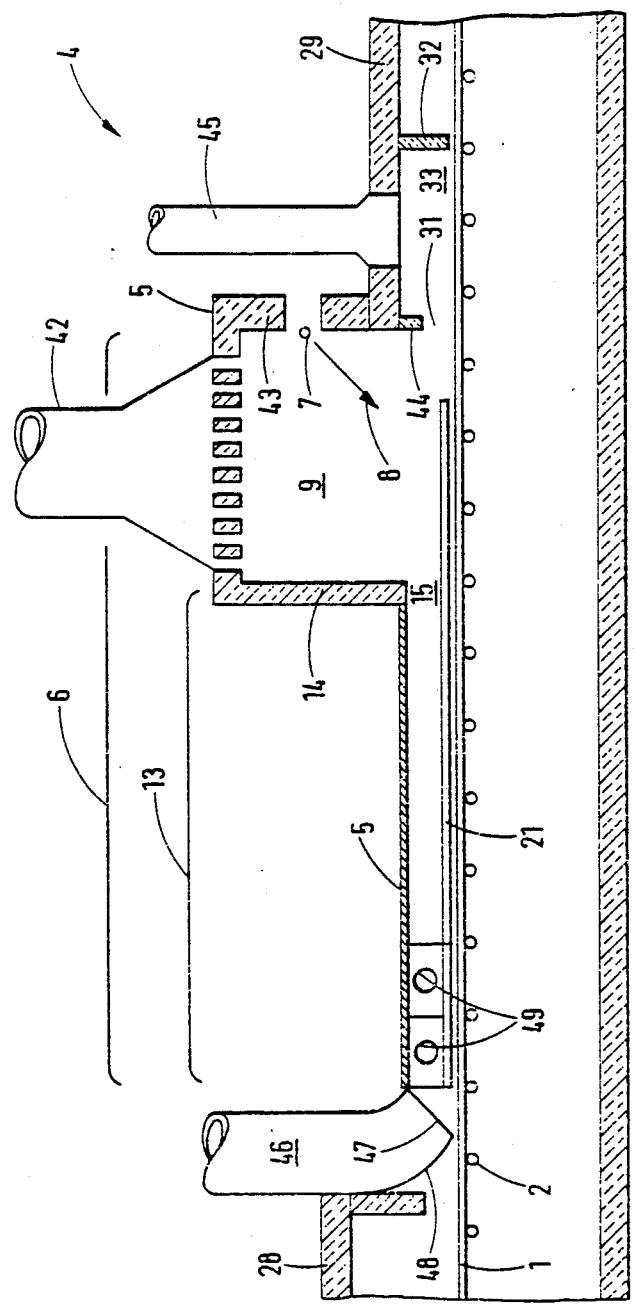
Figure 4:
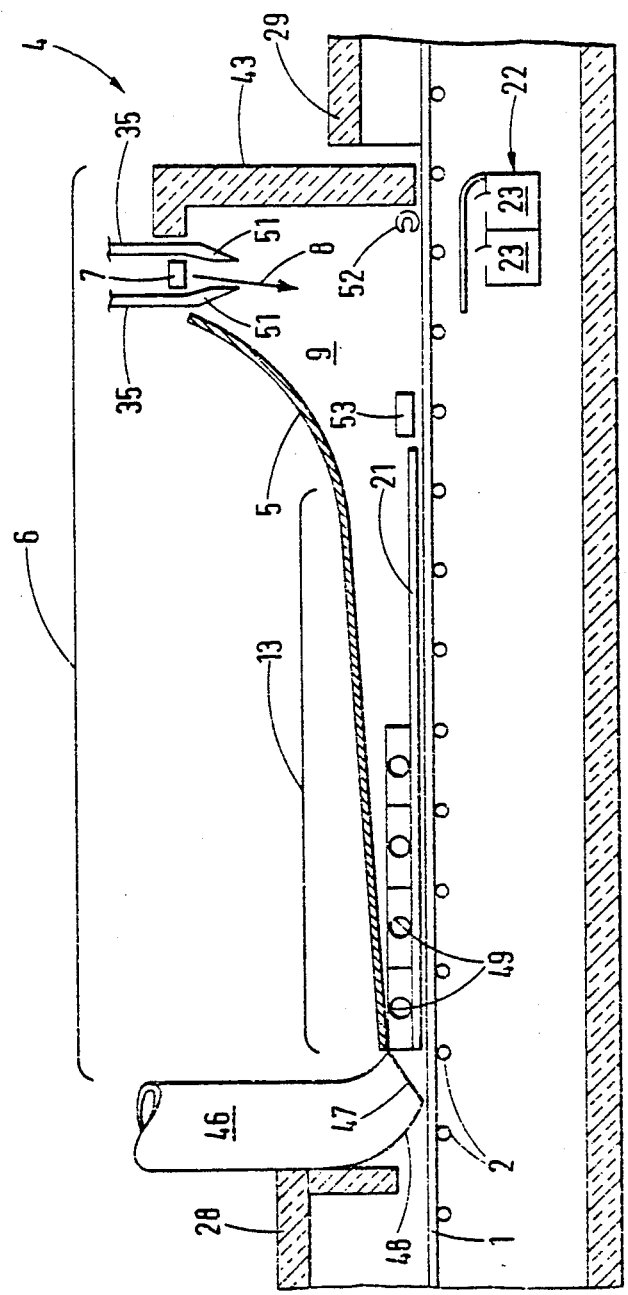
Figure 5:
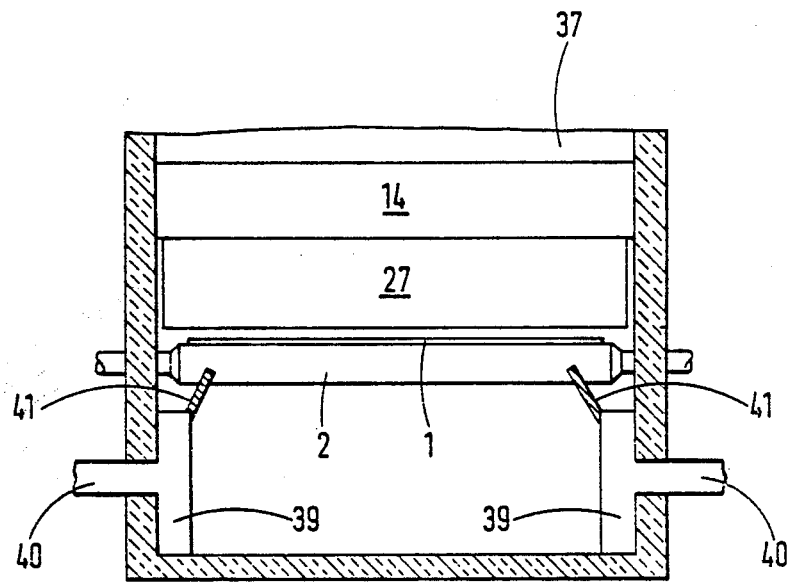

In the drawings, each of FIGS. 1 to 4 is a cross-sectional side view of an embodiment of coating apparatus in accordance with the invention, and FIG. 5 is a section along the line V—V of FIG. 2.

FIG. 1

In FIG. 1, apparatus for pyrolytically forming a metal compound coating on an upper face of a hot glass substrate 1 in sheet or ribbon form comprises conveyor means such as rollers 2 for conveying a said substrate in a downstream direction 3 along a path also indicated by reference numeral 1. The path 1 leads through a coating station 4 comprising a roof structure 5 defining a coating chamber 6 opening downwardly onto the substrate path 1 and a spray nozzle diagrammatically represented at 7 for spraying a stream of coating precursor solution into the chamber 6, in a direction 8 downwardly towards the substrate 1.

The spray nozzle 7 is located to spray the stream of coating precursor solution into a spraying zone 9 of the coating chamber 6 from a height of at least 75cm above the substrate path 1. In the embodiment illustrated, the spray nozzle 7 is located to spray coating precursor material from at least 1 meter, and preferably at least 1.2 meters, above the substrate path 1, and it is of a type well known per se. The nozzle is arranged to spray the coating precursor solution in the direction 8 leading downwardly towards the substrate 1, and in the downstream direction 3, and it is movable to and fro along a track (not shown) across the width of the substrate path.

Heating means is provided for supplying heat to said spraying zone. In the embodiment illustrated, such heating means comprises downwardly directed radiant heaters 10 provided in the roof of the spraying zone 9. As additional heating means, ducting 11 is provided for discharging a stream of preheated gas into the spraying zone 9 in a direction to intersect the sprayed stream of coating precursor material. The ducting 11 has its discharge orifice 12 located in the upper half of the height between the spray nozzle 7 and the substrate 1, and is arranged to discharge that gas stream from upstream of the coating precursor spray discharge axis 8. The orifice 12 extends horizontally over the full width of the substrate path 1, and vertically over the upper third of the height of the spray nozzle 7 above the glass substrate. Gas discharged from orifice 12 is initially directed substantially horizontally, across the transverse path of the droplet stream 7, to maintain a circulation of gas within the spraying zone 9.

The discharged gas is suitably preheated, for example to a mean temperature in the range 300° C. to 500° C. The heaters 10 promote evaporation of solvent from the sprayed droplets during their travel towards the substrate 1 which can then be entrained in the hot discharged gas.

In an optional variant embodiment, the ducting 11 is divided into two ducts terminating in equal sized upper and lower orifices occupying the position of the orifice 12 so that currents of gas at different levels there.

The roof structure 5 defines a passageway portion 13 of the coating chamber 6 leading downstream from the spraying zone 9 and imparting to the coating chamber 6 a total length of at least 2 meters, and preferably a length of at least 5 meters. In the embodiment illustrated, the roof structure 5 includes a bridge wall 14 over the substrate path which descends substantially vertically to define an exit slot 15 at the downstream end of the spraying zone separating that zone from the passageway, and the passageway 13 has a height substantially equal to that of the spraying zone 9. The height of the exit slot 15 is less than half of the height between the spray nozzle 7 and the substrate 1.

Upstream of the discharge axis 8 of the precursor spray nozzle 7, a gas jet nozzle diagrammatically represented at 16 is provided for discharging a jet of gas downwardly in the vicinity of the coating precursor stream thereby to shield the sprayed coating precursor material. The gas jet nozzle 16 is ganged to the coating spray nozzle 7 for repeated displacement therewith along the transverse track. A principal effect of this shielding jet of gas is to prevent the entrainment of coating reaction products and other pollutants in the rear of the stream 7 of coating precursor material as it travels towards the uncoated surface of the substrate 1.

Exhaust ducting 17, 18, 19 is located along the lofty passageway 13, and the exhaust ducting 17 at the downstream end of the coating chamber has an inlet 20 located over the substrate path 1 and extending across at least the major part of its width.

Baffles such as 21, projecting inwardly from the side walls of the coating chamber 6 are provided for inhibiting flow of atmospheric material past the sides of the substrate path 1 and between zones vertically above and vertically below that path over the length of the spraying zone 9, where the atmosphere will be richest in coating precursor material. Those baffles may be mounted on pivots on the side walls of the coating chamber 6 and be supported e.g. by threaded struts so that their position is adjustable for minimum clearance with the margin of the substrate 1.

Means 22 is provided for discharging gas into the environment of the substrate 1 so as to form a continuous current flowing in the downstream direction 3 beneath each margin of the substrate path 1 and along at least part of the path length occupied by the coating chamber 6.

The below ribbon gas discharge means comprises four plenum chambers 23 located two by two and extending across substantially the full width of the coating station 4. In the top of each plenum chamber 23 is formed a slot 24 bordered by a deflector lip 25 so that gas injected through the slots 24 is directed in the downstream direction 3 along the coating station 4. The slots 24 extend the full length of each plenum chamber 23 across the coating station 4. If desired such slots could be replaced by a plurality of spaced orifices. As shown in FIG. 1, a deflector plate 26 is located above the plenum chambers 23 so that the injected gas is not discharged directly against the substrate 1. The plenum chambers 23 may be fed with preheated gas from both sides of the coating station 4, for example from heat exchangers. Air may be used as the discharged gas and this may readily be heated by heat exchange with furnace flue gases. Such gas is preferably preheated to within 50° C. of the temperature of the substrate as the latter enters the coating chamber 6.

Gas discharged beneath the substrate 1 may be removed from the environment of the substrate 1 through optional exhaust ducting (not shown) having one or more inlets extending transversely under the substrate path for example located in register with the above path exhaust inlet 20.

A barrier wall 27 is provided above the substrate path 1 and extending across the full width of and substantially closing the downstream end of the coating chamber 6, so as substantially to prevent the flow of atmospheric material into or out of the coating chamber 6 at the downstream end of the passageway 13.

The coating station 4 is located between the exit from a ribbon forming plant (not shown), for example a float tank, and the entrance to an annealing lehr 28.

A passage from the ribbon forming plant to the coating chamber 6 has a roof 29, and the upstream end of the coating chamber is determined by a screening wall 30 depending from the passage roof 29 allowing small clearance for the substrate 1 to pass into the coating chamber via an entry slot 31.

The effect of this screening wall 30 is to limit the flow of atmospheric material into the coating chamber 6 from the upstream direction, so that atmospheric conditions within that region can more easily be controlled.

Upstream of the screening wall 30, between that wall and a second screening wall 32, there is an antechamber 33 in which heaters 34 are provided to preheat any gas drawn into the coating chamber 6 between the screening wall 11 and the ribbon 1.

EXAMPLE 1

In a specific practical embodiment of the apparatus shown in FIG. 1, the coating chamber 6 is a little over 3 meters wide to accommodate glass ribbons having a width of up to about 3 meters. The roof structure 5 above the spraying zone 9 of the coating chamber is just over 1.5 meters above the level of the ribbon path 1, and the spraying orifice of the droplet discharge nozzle 7 is close to the level of that roof. That nozzle 7 is arranged to discharge a conical stream of droplets with a half cone angle of 10° with its axis 8 at an angle of 47° to the horizontal: the gas jet nozzle 16 has its outlet 25cm below and 7cm downstream of the spray nozzle 7 and is arranged with its axis at 60° to the horizontal. The gas discharge orifice 12 is 50cm high with its top level with the nozzle 7. The bridge wall 14 at the downstream end of the spraying zone 9 is separated from the gas current discharge orifice 12 by a distance of 2.8 meters. The passageway 13 has the same height as the spraying zone 9, and the exit slot 15 has a height of 50cm above the level of the ribbon path 1. The length of that passageway is 4 meters.

This apparatus is particularly designed for the deposition of tin oxide coatings starting from a solution of stannous chloride as coating precursor material.

Using such apparatus, a tin oxide coating 750nm in thickness was formed on a 6mm thick ribbon of glass travelling at a speed of 8.5m/min. The glass entered the coating chamber at a temperature of 600° C., and the coating precursor used was an aqueous solution of stannous chloride containing ammonium bifluoride for the provision of doping ions in the coating. This solution was sprayed from the nozzle at a rate of 220L/h while the nozzle was reciprocated across the ribbon path at 22 cycles per minute.

The antechamber 33 was substantially closed, and the atmosphere therein was heated by electrical resistance heaters.

Radiant heaters in the roof of the spraying zone were switched on and gas was discharged through the orifice 12 at a rate of 7000Nm$^3$/min and a temperature of 400° C. Gas was discharged from the below ribbon plenum boxes 23 at a temperature of 600° C.

In operation it was found that by the time the stream of sprayed coating precursor material reached the level of the ribbon a substantial proportion of the solvent had evaporated from the stream, leaving very small droplets of liquid stannous chloride and stannous chloride vapour to contact the glass to initiate coating formation. The spraying zone 9 above the ribbon was filled with a circulating atmosphere laden with stannous chloride vapour, and this was drawn through the exit slot 15 and into the passageway 13 by aspirating forces generated in exhaust ducting 17, 18, 19. It was found that the atmosphere within the coating chamber 6 was substantially clear, except in the vicinity of the droplet stream, indicating that substantially all the stannous chloride and solvent outside that stream was in vapour phase, so that over the greater part of the length of the coating chamber 6 in which the glass was exposed to coating precursor material, the atmosphere in that chamber 1 was substantially free from material in the liquid phase. Of course the passageway 13 also contained coating reaction products. The forces generated and the geometry of that passageway were such that atmospheric material leaving the exit slot 15 slowed down and the rather dense stannous chloride vapours tended to form a layer in contact with the coating being formed to allow conditioning of that coating, while the less dense solvent vapour and coating reaction products tended to flow more directly towards the exhaust ducting. As a result of all this, the coating formed had a fine crystal structure at the glass/coating interface which promoted a high quality uniform coating structure and hence good optical qualities, and the inclusion of coating reaction products which would lead to defects tended to be avoided.

Especially noteworthy was the very low haze, and very uniform haze exhibited by the coated glass.

FIGS. 2 & 5

In FIGS. 2 and 5, integers serving analogous functions to those illustrated in FIG. 1 have been allotted corresponding reference numerals.

In the spraying zone 9 at the upstream end of the coating chamber 6, gas discharge ducting 11 is absent, but is replaced by a pair of ducts 35 having discharge orifices 36 which are directed towards one another for the discharge of preheated gas from opposite sides of the axis 8 of the sprayed stream of coating precursor material. No other heating means for the coating chamber is shown above the level of the ribbon 1. The discharge orifices 36 extend across almost the full width of the coating chamber 6, and they are confined to the upper third of the height of the spray nozzle 7 above the substrate. In a variant, the discharge orifices 36 have a lesser width and they are moved to and fro across the spraying zone in tandem with the spray nozzle 7.

At the downstream side of the spraying zone 9, the roof structure 5 is inclined downwardly and then forms a vertical bridge wall 14 in which is located a full width inlet 37 for exhaust ducting 38 for the aspiration of vapours from the spraying zone to prevent the formation of any stagnant zone therein.

Downstream of the exit slot 15 beneath the bridge wall 14, the roof structure 5 continues to define a passageway portion 13 of the coating chamber 6 which has the same height as that exit slot.

Along the length of that passageway 13, exhaust means is provided at each side of the coating chamber beneath the level of the substrate path 1. This exhaust means comprises a plurality of open-topped exhaust boxes 39 communicating with side exhaust ducts 40. From FIG. 2 it will be noted that these exhaust boxes 39 extend over the full length of the substrate path occupied by the passageway 13, and that the upstream exhaust box is in fact located beneath the spraying zone 9. Projecting upwardly and inwardly from the exhaust boxes are provided baffles 41 which extend beneath the margins of the substrate path and upwardly between the conveyor rollers 2. This arrangement provides an effective separation of the atmospheres vertically above and vertically below the substrate path along the passageway.

In order to inhibit coating precursor and other atmospheric material from flowing down past the sides of the substrate path over a more upstream region of the spraying zone 9, blowers 50 for discharging preheated air are provided to maintain an upward flow of relatively clean gas against the side walls of the coating chamber there. This also gives some degree of protection to those walls from corrosion due to the atmosphere within the chamber.

EXAMPLE 2

The apparatus of FIG. 2 was used to form a coating of the same thickness as in Example 1 using the same precursor material and on a ribbon of glass of the same thickness and moving at the same speed. The spray nozzle 7 was also controlled as in Example 1. The coating chamber 6 had a total length of 7.5 meters.

The glass entered the coating chamber 6 at a temperature of 600° C., and air preheated to 500° C. was discharged at a rate of 3600Nm$^3$/h from each of the discharge orifices 36. As a result, a major proportion of the sprayed material was evaporated during its trajectory towards the ribbon, while a residual stream continued and impacted positively against the glass.

The below path level aspiration of atmospheric material along the passageway tends to hold down a layer of precursor vapour laden atmosphere in contact with the ribbon to promote finishing of the coating. The aspiration was performed at a total rate of about 70,000m$^3$/h at a mean temperature of about 350° C.

This also gave excellent results in terms of the uniformly high quality of the coating formed, especially in regard to its low and uniformly low haze factor.

FIG. 3

In FIG. 3, integers serving analogous functions to those illustrated in FIGS. 1 and 2 have again been allotted corresponding reference numerals.

The spraying zone 9 is of similar shape to that shown in FIG. 1, but in FIG. 3, means for introducing preheated gas into that zone comprises discharge ducting 42 ending in a plurality of discharge orifices in the roof 5 of the coating chamber and distributed over most of its area. The track of the spray nozzle 7 runs along an upstream end wall 43 of the coating chamber.

Beneath that upstream end wall 43, the screening wall 30 shown in FIGS. 1 and 2 is replaced by a bridge wall 44 allowing a rather taller entry slot 31 so that atmospheric material can be drawn along in contact with the glass and into the coating chamber from the antechamber 33 more easily. If desired that bridge wall 44 can be adjustable in height for varying the opening of the entry slot 31. Additional gas discharge ducting 45 is provided for discharging preheated gas downwardly into the antechamber for control of the layer of atmospheric material immediately above the substrate 1 up to at least the zone where the stream of coating material 8 impinges against the glass.

This embodiment of the present invention thus makes use of the invention described and claimed in our said copending British Patent Application filed on this date (Dec. 20, 1985, Application Number 85 31 425).

As in FIG. 2, the passageway has the same height as the exit slot from the spraying zone.

At the downstream end of the passageway 13, atmospheric material is aspirated into exhaust ducting 46 having an inlet 47 defined in part by a curved exhaust scoop 48 which extends above the path of the substrate 1 across the full width of the passageway, and substantially closes its downstream end. Such scoop 48 may optionally be mounted pivotally so that it can be adjusted for minimum clearance with the substrate 1. Also at the downstream end of the passageway 13, atmospheric material is aspirated into exhaust ducting 49 located to each side of the coating chamber, in order to encourage a lateral spread of the atmospheric material flowing along the coating chamber. Such material is also inhibited from flowing beneath the substrate by baffles such as 21 projecting from the side walls of the coating chamber over the substrate margins along substantially the whole length of the passageway and extending well into the spraying zone, almost up to its upstream end.

EXAMPLE 3

The apparatus of FIG. 3 was used to form a coating of mixed titanium dioxide and ferric oxide on a 5mm thick sheets of glass travelling at 10m/min, using a starting solution of titanium acetylacetonate and iron (III) acetylacetonate. The glass entered the coating chamber 6 at a temperature of 580° C. and that chamber was 6 meters long.

The solution was discharged at a rate of about 80L/h with a pressure of about 25 bar, in order to obtain a coating 45nm thick which was yellowish and highly reflective. The spray nozzle was located at a height of 1.2 meters above the ribbon, inclined to the horizontal by 30°, and it was reciprocated across the substrate path at a rate of 20 cycles per minute.

Air preheated to a temperature of 350° C. was blown through the roof of the spraying zone at a rate of about 1500Nm$^3$/h, and air preheated to a temperature of 580° was blown down into the antechamber 33 at a rate of about 3000Nm$^3$/h. Part of the sprayed stream was evaporated before contact with the glass, and part continued for positive impact against the glass.

The rate of aspiration at the downstream exhaust ducting 46, 49 was regulated to compensate for the total quantity of gas blown or drawn into the coating chamber, due allowance also being made for the creation of gas within the chamber due to evaporation of the sprayed material.

This process also resulted in the formation of a highly uniform and substantially defect-free coating.

FIG. 4

As before, integers serving analogous functions to those shown in the previous Figures have again been allotted corresponding reference numerals.

In the embodiment of FIG. 4, the single reciprocating spray nozzle 7 of the previous Figures is replaced by a plurality of such nozzles, though only one is shown. These nozzles 7 reciprocate along portions of a track (not shown) running between a pair of gas discharge ducts 35 having downwardly inclined discharge orifices 51 extending over the full width of the coating chamber.

The roof structure 5 descends in a continuous partly curved profile above the spraying zone 9, and it continues to descend so that the passageway 13 is of decreasing height in the downstream direction, and facilitating a smooth general downstream flow of material within the coating chamber 6. As in FIG. 3, side exhaust ducts 49 are provided for aspirating atmospheric material from the passageway at its downstream end, but in this Figure, those aspirators occupy slightly more than half of the length of the passageway. The descent of the roof 5 of the passageway compensates for the reduced quantity of material flowing along the passageway due to this increased aspiration.

At the upstream end of the coating chamber, end wall 43 descends close to the path of the substrate 1, substantially closing that end of the chamber, and just downstream of that end wall, there is provided an auxiliary gas discharge conduit 52 for discharging preheated gas into the chamber adjacent the substrate to flow in the downstream direction, to condition the atmosphere in contact with the substrate where it is first contacted by the coating precursor material, and to inhibit the accumulation of vapour against the upstream end wall 43.

At the downstream end of the spraying zone, a pair of horizontally directed inwardly inclined gas jet discharge nozzles 53 are provided for entraining the coating precursor vapour which will be generated within the spraying zone inwardly away from the side walls of the passageway and in the downstream direction.

EXAMPLE 4

A 400nm thick fluorine doped tin oxide coating was formed on a 4mm thick ribbon of glass travelling from a float chamber at a speed of 8.5m/min to enter the coating station at a temperature of 600° C. The coating chamber had a total length of 8 meters.

The coating precursor used was an aqueous solution of stannous chloride containing ammonium bifluoride for the provision of doping ions in the coating. This solution was sprayed from the nozzles at a rate of 110L/h. The nozzles were all parallel and were inclined to the horizontal by 75°. They were located 1.5m above the substrate.

Air preheated to 550° C. was discharged at a rate of 5000Nm$^3$/h from the two discharge orifices 51 to entrain evaporated precursor solution, and the air discharged from the auxiliary gas discharge conduit 52 was also preheated to 500° C. Aspiration above the level of the substrate was controlled to balance the quantity of gas introduced into or formed within the coating chamber and to promote a general downstream flow of material.

Air preheated to 600° C. was discharged at a rate of 3000Nm$^3$/h from the below substrate path discharge means 22.

This process also resulted in the formation of a highly uniform coating, substantially free from local defects and with a very low, and uniformly low, haze factor.

EXAMPLES 5 to 8

In a variant of each of the foregoing Examples, the apparatus illustrated is used to form a coating onto glass which has been cut into sheets and then reheated, by processes otherwise as described.

Similar results are given.

We claim:

1. Apparatus for use in pyrolytically forming a metal oxide coating on an upper face of a hot glass substrate in sheet or ribbon form, the apparatus comprising:

conveyor means for conveying the hot glass substrate in a downstream direction along a coating path with an extended coating path length of at least 2m;

a roof structure defining a coating chamber opening downwardly onto the coating path and a passageway, wherein the coating chamber is positioned within or adjacent to the upstream end of the passageway and has a spraying zone and a coating chamber atmosphere;

means for spraying a solution of coating precursor material in the form of a volatilizable solution comprised of solvent and a metallic compound, which metallic compound is soluble in the solvent and is pyrolyzable by the hot glass substrate to form a metal oxide coating thereon, downwardly towards the upper face of the hot glass substrate positioned within the coating chamber from a height of at least 75cm above the upper face of the hot glass substrate;

means for supplying heat energy to the coating chamber to vaporize at least a portion of the solution of coating precursor material before it reaches the upper face of the hot glass substrate and to thereby charge the coating chamber atmosphere with vaporized coating precursor material, the coating chamber being in communication with the passageway to permit a stream of the coating chamber atmosphere charged with vaporized coating precursor material to flow along the passageway from the coating chamber; and pressure lowering means for causing the coating chamber atmosphere to flow continuously from the coating chamber along the coating path and in contact with the upper face of the substrate for a contact time of at least 10 seconds.

2. The apparatus according to claim 1, wherein means is provided for blowing gas upwardly past each side of the coating path in the spraying zone.

3. The apparatus according to claim 1, wherein means is provided for inhibiting flow of atmospheric material past the sides of the coating path and between zones vertically above and vertically below the coating path over at least part of the length of the coating chamber.

4. Apparatus according to claim 3, wherein such flow inhibiting means comprises baffles.

5. The apparatus according to claim 1, wherein side exhaust ducting is provided and wherein means is provided for generating aspirating forces in the side exhaust ducting, which side exhaust ducting is located to cause atmospheric material above the coating path to flow outwardly away from the center of the coating path over at least a portion of the passageway.

6. Apparatus according to claim 5, wherein said side exhaust ducting is located to aspirate said atmospheric material outwardly over a zone extending along substantially the whole of said passageway.

7. Apparatus according to claim 5, wherein said side exhaust ducting has entrances which are located beneath the level of the substrate path.

8. The apparatus according to claim 1, wherein means is provided for discharging gas into the environment of the hot glass substrate so as to form a continuous current flowing in the downstream direction beneath each margin of the coating path and along at least part of the coating path length within the coating chamber.

9. Apparatus according to claim 8, wherein the means for discharging gas to form such a below path level current is arranged to discharge gas to form such a current across the full width of the substrate path.

10. The apparatus according to claim 1, wherein the extended coating path length is at least 5 meters.

11. The apparatus according to claim 1, wherein the means for spraying is positioned to spray from a height of at least 1.2 meters.

12. The apparatus according to claim 1, wherein at the downstream end of the spraying zone, the roof structure descends substantially vertically to define an exit slot leading into the passageway.

13. The apparatus according to claim 12, wherein the height of the exit slot is at most half of the distance between the means for spraying and the coating path.

14. The apparatus according to claim 1, wherein at least a part of the length of the passageway has a height which is less than that of the spraying zone.

15. The apparatus according to claim 1, wherein the roof structure converges towards the coating path in the downstream direction over the length of the passageway.

16. The apparatus according to claim 1, wherein the roof structure includes a bridge wall over the coating path defining an exit slot having a slot width from the spraying zone and separating the spraying zone and the passageway, the passageway having a height which is greater than the slot width of the exit slot.

17. The apparatus according to claim 1, wherein the means for spraying is arranged to spray the solution of coating precursor material in the downstream direction.

18. The apparatus according to claim 1, wherein means is provided for discharging the solution of coating precursor material and wherein means is provided for discharging at least one stream of gas into the spraying zone in intersecting directions.

19. The apparatus according to claim 18, wherein there is at least one means for discharging at least one stream of gas, the at least one means for discharging having a discharge orifice located between the means for spraying and the upper face of the hot glass substrate in the upper half therebetween.

20. The apparatus according to claim 18, wherein means is provided for preheating the at least one stream of gas.

21. The apparatus according to claim 18, wherein the means for spraying has a spray discharge axis and wherein there is at least one means for discharging at least one stream of gas, which means is arranged to discharge a gas stream from upstream of the spray discharge axis.

22. The apparatus according to claim 1, wherein downwardly directed radiant heating means is provided above the spraying zone.

23. The apparatus according to claim 1, wherein means is provided for heating the passageway from above.

24. The apparatus according to claim 1, wherein the means for spraying has a spray discharge axis and wherein means is provided upstream of the spray discharge axis for discharging a jet of gas downwardly in the vicinity of the spray discharge axis to thereby shield the coating precursor material after spraying.

25. The apparatus according to claim 24, wherein means is provided for repeatedly displacing the means for discharging a jet of gas along a path transverse to the coating path in tandem with a coating precursor spray nozzle.

26. The apparatus according to claim 1, wherein the means for spraying a solution of coating precursor material comprises a spray nozzle and means for repeatedly displacing the spray nozzle along a path transverse to the coating path of the substrate.

27. The apparatus according to claim 1, wherein exhaust ducting is located at the downstream end of the coating chamber and has at least one exhaust inlet located over the coating path and extending across at least a major part of the width of the coating path.

28. The apparatus according to claim 27, wherein a curved exhaust scoop is provided at the at least one exhaust inlet.

29. The apparatus according to claim 1, wherein a barrier wall is provided above the coating path and extends across the full width of and substantially closing the downstream end of the coating chamber.

30. The apparatus according to claim 1, wherein the apparatus is located between an exit from a ribbon forming plant and an entrance to an annealing lehr.

31. The apparatus according to claim 1, wherein the coating chamber has a substrate entry slot and wherein means is provided for causing gas to flow through the substrate entry slot of the coating chamber from upstream thereof and for preheating said gas.

32. The apparatus according to claim 31, wherein the means for causing gas to flow, and/or the shape of the substrate entry slot, is such as to cause a greater volume flow rate of said gas over margins of the coating path than over the centerline of the coating path.

33. A process for pyrolytically forming a metal oxide coating on an upper face of a hot glass substrate in sheet or ribbon form, comprising:
   a. conveying the hot glass substrate in a downstream direction along an apparatus having a coating path with an extended coating path length of at least 2m and including a coating chamber having a spraying zone and a coating chamber atmosphere, and a passageway defined within the apparatus, the coating path leading beneath the coating chamber and the coating chamber opening downwardly onto the upper face of the hot glass substrate;
   b. spraying downwardly towards the upper face of the hot glass substrate positioned within the coating chamber a solution of coating precursor material, which solution of coating precursor material is in the form of a volatilizable solution comprised of solvent and a metallic compound, which metallic compound is soluble in the solvent and is pyrolyzable by the hot glass substrate to form a metal oxide coating thereon, and which coating chamber is positioned within or adjacent to the upstream end of said passageway;

c. supplying heat energy to the coating chamber to vaporize at least a portion of the coating precursor material before it reaches the upper face of the hot glass substrate and to thereby charge the coating chamber atmosphere with vaporized coating precursor material; and d. causing the coating chamber atmosphere charged with vaporized coating precursor material to flow continuously from the coating chamber along the coating path in a downstream direction and in contact with the upper face of the hot glass substrate for a contact time of at least 10 seconds by pressure lowering means, wherein spraying in step b is from a height of at least 75cm above the upper face of the hot glass substrate and with sufficient energy to ensure a positive impact of any non-vaporized solution of coating precursor material.

34. The process according to claim 33, wherein gas is blown upwardly past each side of the coating path in the spraying zone.

35. The process according to claim 33, wherein side exhaust ducting is provided and wherein aspirating forces are generated in the side exhaust ducting, which side exhaust ducting is located to cause atmospheric material above the hot glass substrate to flow outwardly away from a central part of the coating path over at least a portion of the length of the coating chamber.

36. A process according to claim 35, wherein said atmospheric material is caused to flow outwardly over a zone extending along at least the major part of the length of said coating chamber downstream of the zone of first deposition of coating material on the substrate.

37. A process according to claim 35, wherein said atmospheric material is aspirated outwardly at a level beneath the substrate.

38. The process according to claim 33, wherein gas is discharged into the environment of the hot glass substrate so as to form a continuous current flowing in the downstream direction beneath each margin of the coating path and along at least part of the length of the coating chamber.

39. A process according to claim 38, wherein there is such a below-substrate current of gas which flows under the full width of the substrate.

40. The process according to claim 33, wherein the extended coating path length is so related to conveying speed of the hot glass substrate in step a that the hot glass substrate remains exposed to the coating chamber atmosphere containing coating precursor material vapor for a contact time of at least twenty seconds.

41. The process according to claim 33, wherein the solution of coating precursor material is sprayed from a spray source having a height of at least 1.2 meters.

42. The process according to claim 33, wherein the coating chamber atmosphere is withdrawn from the spraying zone into a downstream passageway portion of the coating chamber via an exit slot having a height which is less than the height of the spraying zone.

43. The process according to claim 42, wherein the solution of coating precursor material is sprayed from a spray source, wherein the exit slot is positioned between the spray source and the upper face of the hot glass substrate, and wherein the exit slot is positioned at a height of at most half of the distance between the spray source and the upper face of the hot glass substrates.

44. The process according to claim 33, wherein the passageway is heated.

45. The process according to claim 33, wherein the solution of coating precursor material is sprayed in the downstream direction.

46. The process according to claim 33, wherein the solution of coating precursor material and at least one stream of gas are introduced into the spraying zone so that their trajectories intersect therein.

47. The process according to claim 46, wherein the solution is sprayed from a spray source and wherein there is at least one means for discharging the at least one stream of gas, the at least one means for discharging having an orifice located between the spray source and the upper face of the hot glass substrate in the upper half therebetween.

48. The process according to claim 46, wherein at least one of the at least one stream of gas is preheated gas.

49. The process according to claim 46, wherein at least one of the at least one stream of gas is discharged from the upstream side of the trajectory of the solution of coating precursor material being sprayed in step b.

50. The process according to claim 33, wherein the solution of coating precursor material in step b has a spray path and wherein heat is supplied to the spraying zone at least in part by directing radiant heat downwardly from above said spray path.

51. The process according to claim 33, wherein the solution of coating precursor material is sprayed as a stream and wherein the stream is shielded by a jet of gas provided upstream of the stream, which jet of gas is continuously discharged downwardly towards the hot glass substrate in the vicinity of the stream.

52. The process according to claim 51, wherein the jet of gas is repeatedly displaced transversely of said coating path in tandem with the stream of the solution of coating precursor material.

53. The process according to claim 33, wherein the solution of coating precursor material is sprayed in step b as a droplet stream which is repeatedly displaced transversely of the coating path.

54. The process according to claim 33, wherein over at least a part of the length of the coating chamber, flow of ambient atmosphere past side edges of the hot glass substrate and between zones vertically above and vertically below the hot glass substrate is inhibited.

55. The process according to claim 33, wherein the coating chamber is substantially closed at its downstream end to prevent interchange of ambient atmosphere between the downstream end of the coating chamber and a further downstream region of the coating path.

56. The process according to claim 55, wherein the hot glass substrate is a freshly formed ribbon of hot glass and a metal oxide coating is formed thereon after the ribbon leaves a ribbon forming plant and before its entrance to an annealing lehr.

57. The process according to claim 33, wherein preheated gas is caused to flow downstream into the coating chamber in contact with the hot glass substrate.

58. The process according to claim 57, wherein the preheated gas is caused to enter the coating chamber at a volume rate which is higher over the margins of the hot glass substrate than over the centerline thereof.

* * * * *